United States Patent
Yamaguchi et al.

(10) Patent No.: US 7,855,406 B2
(45) Date of Patent: Dec. 21, 2010

(54) SOLID-STATE IMAGING DEVICE AND METHOD OF MANUFACTURING THE SAME

(75) Inventors: Tetsuya Yamaguchi, Tokyo (JP);
Hiroshige Goto, Yokohama (JP);
Hirofumi Yamashita, Kawasaki (JP);
Ikuko Inoue, Yokohama (JP); Nagataka Tanaka, Yokohama (JP); Hisanori Ihara, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 623 days.

(21) Appl. No.: 11/776,791

(22) Filed: Jul. 12, 2007

(65) Prior Publication Data

US 2008/0012088 A1     Jan. 17, 2008

(30) Foreign Application Priority Data

Jul. 13, 2006 (JP) .............................. 2006-193131

(51) Int. Cl.
*H01L 31/062* (2006.01)
(52) U.S. Cl. .................. 257/290; 257/291; 257/292; 257/258; 257/E27.133
(58) Field of Classification Search .................. 257/290, 257/291, 292, 258, E27.133
See application file for complete search history.

(56) References Cited

U.S. PATENT DOCUMENTS

| | | | | |
|---|---|---|---|---|
| 5,283,460 | A * | 2/1994 | Mita | 257/432 |
| 6,380,603 | B1 * | 4/2002 | Takimoto et al. | 257/463 |
| 6,403,998 | B1 | 6/2002 | Inoue | |
| 6,433,374 | B1 * | 8/2002 | Fukunaga et al. | 257/292 |
| 6,469,365 | B1 * | 10/2002 | Werner | 257/544 |
| 6,885,047 | B2 * | 4/2005 | Shinohara et al. | 257/292 |
| 7,091,536 | B2 * | 8/2006 | Rhodes et al. | 257/291 |
| 7,456,453 | B2 * | 11/2008 | Inoue | 257/292 |
| 7,473,945 | B2 * | 1/2009 | Takahashi et al. | 257/233 |
| 2003/0127667 | A1 | 7/2003 | Inoue et al. | |
| 2005/0173742 | A1 | 8/2005 | Ihara | |
| 2005/0218436 | A1 | 10/2005 | Yamaguchi et al. | |
| 2006/0132632 | A1 | 6/2006 | Ihara | |
| 2006/0219867 | A1 | 10/2006 | Yamaguchi et al. | |
| 2007/0045679 | A1 * | 3/2007 | McKee et al. | 257/291 |

FOREIGN PATENT DOCUMENTS

| JP | 2001-160620 | 6/2001 |
|---|---|---|
| JP | 2001-223351 | 8/2001 |
| JP | 2006-286933 | 10/2006 |

OTHER PUBLICATIONS

U.S. Appl. No. 11/874,479, filed Oct. 18, 2007, Inoue.
U.S. Appl. No. 12/725,625, filed Mar. 17, 2010, Yamaguchi.

* cited by examiner

*Primary Examiner*—Eugene Lee
(74) *Attorney, Agent, or Firm*—Oblon, Spivak, McClelland, Maier & Neustadt, L.L.P.

(57) ABSTRACT

An $n/p^-/p^+$ substrate where a $p^-$-type epitaxial layer and an n-type epitaxial layer have been deposited on a $p^+$-type substrate is provided. In the surface region of the n-type epitaxial layer, the n-type region of a photoelectric conversion part has been formed. Furthermore, a barrier layer composed of a p-type semiconductor region has been formed so as to enclose the n-type region of the photoelectric conversion part in a plane and reach the $p^-$-type epitaxial layer from the substrate surface. A p-type semiconductor region has also been formed at a chip cutting part for dividing the substrate into individual devices so as to reach the $p^-$-type epitaxial layer from the substrate surface.

9 Claims, 3 Drawing Sheets

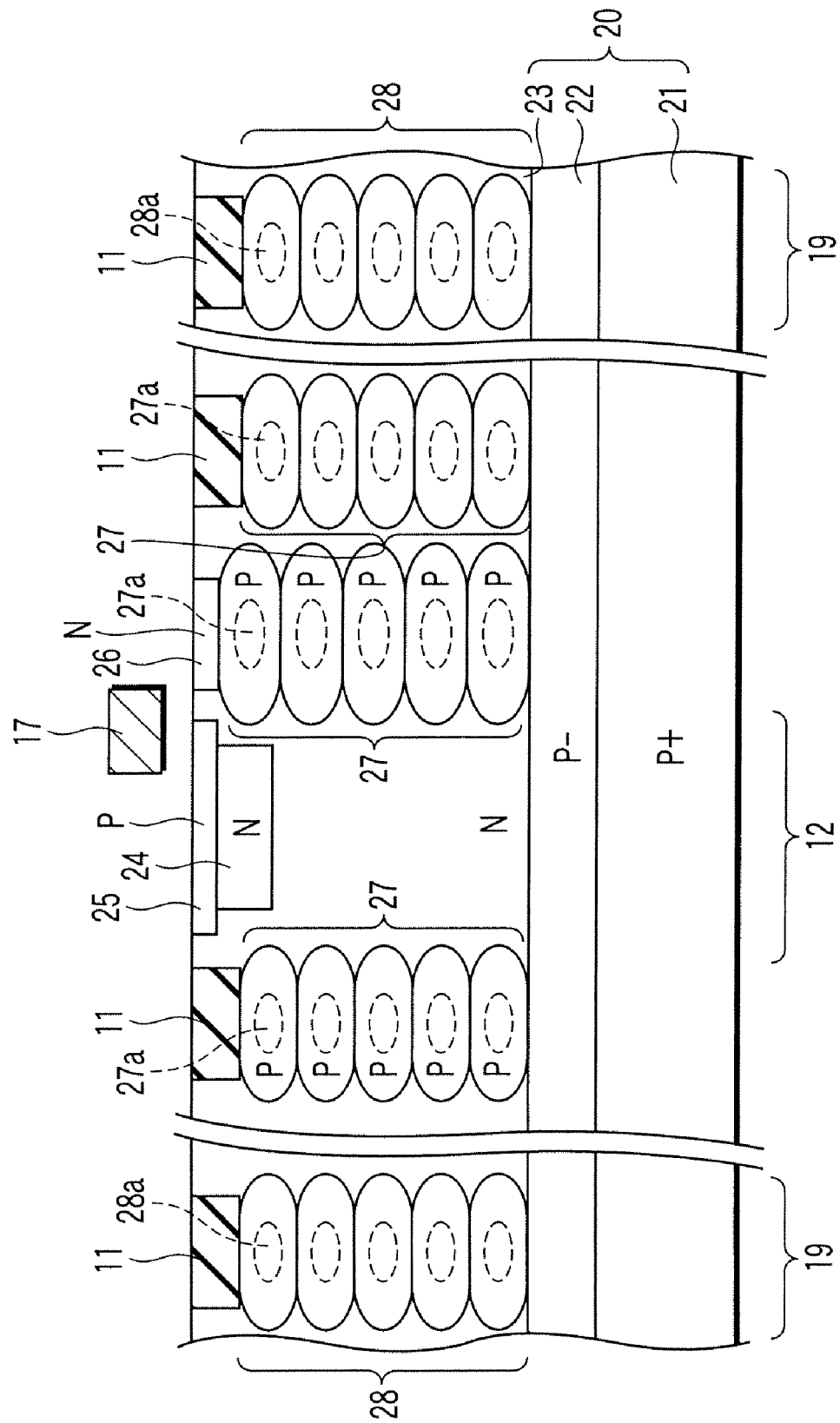
F I G. 3

SOLID-STATE IMAGING DEVICE AND METHOD OF MANUFACTURING THE SAME

CROSS-REFERENCE TO RELATED APPLICATIONS

This application is based upon and claims the benefit of priority from prior Japanese Patent Application No. 2006-193131, filed Jul. 13, 2006, the entire contents of which are incorporated herein by reference.

BACKGROUND OF THE INVENTION

1. Field of the Invention

This invention relates to a solid-state imaging device and a method of manufacturing the same, and more particularly to the structure of a semiconductor substrate and the structure of a dicing region in a CMOS amplification-type solid-state imaging device which is used in, for example, a digital camera.

2. Description of the Related Art

The advantage of a CMOS amplification-type solid-state imaging device (hereinafter, referred to as a CMOS image sensor) is a single power supply which operates at a low voltage of, for example, about 3 V and consumes low power, for example, about 50 mW of electric power. In the device, a plurality of pixels each included of a photoelectric conversion element and a plurality of transistors have been formed on a semiconductor substrate, thereby achieving a multi-pixel configuration. Each pixel has an amplifying function whereby the potential in a signal charge accumulating part is modulated by the signal charge generated by the photoelectric conversion element and the amplifying transistor in the pixel is modulated according to the modulated potential.

In a conventional CMOS image sensor, a $p/p^+$ substrate is used as a semiconductor substrate. In the $p/p^+$ substrate, a p-type epitaxial layer whose impurity concentration is low is formed to a thickness of about 5 to 10 μm on the surface of a $p^+$-type substrate whose impurity concentration is high is used a semiconductor substrate. The reason why the $p/p^+$ substrate is used is that the lifetime of carriers (electrons) is short in a part ($p^+$-type substrate) where the impurity concentration is high in a deep position of the substrate. Specifically, even when a photo diode acting as a photoelectric conversion element is exposed to intense light, generating carriers, which diffuse deeply in the substrate, electrons recombine in a region where the lifetime of carriers is short. Accordingly, carriers overflowed from the photo diode as a result of the exposure of the photo diode to intense light or carriers generated by photoelectric conversion in a deep position of the substrate can be constrained from entering an adjacent photo diode. Therefore, the occurrence of blooming can be suppressed.

Furthermore, with the recent miniaturization of elements, the area of a photo diode is decreased, which causes the problem of deteriorating the sensitivity. The CMOS image sensor is characterized by low-voltage driving. Accordingly, it is difficult to broaden the depletion layer. Therefore, a decrease in the sensitivity resulting from the miniaturization of elements is difficult to compensate for by improving the sensitivity by broadening the depletion layer. To improve the sensitivity of the CMOS image sensor, it is important to use such a substrate structure as can gather carriers efficiently in the photo diode. For this reason, the p/p+ substrate is used. Specifically, in the $p/p^+$ substrate, a region where the B (boron) concentration is low exists in a shallow position of the substrate at the surface of the substrate and a region where the boron concentration is high exists in a deep position of the substrate. As a result, the $p/p^+$ substrate has an interface where the boron concentration changes rapidly. Then, even if electrons generated by photoelectric conversion try to diffuse into a deep place of the substrate, they bounce back from the interface where the boron concentration changes abruptly toward the surface of the substrate. Part of the bounced electrons gather at the photo diode exposed to light as a result of diffusion or the like, which improves the sensitivity.

To make a CMOS image sensor higher in pixel density in the future, not only has technical development to increase sensitivity become an important subject, but also the technique for suppressing the deterioration of picture quality, such as blooming or color mixture, has been desired.

A solid-state imaging device which uses an $n/p^+$ substrate as a substrate structure capable of overcoming both of the two technical problems has been disclosed in the U.S. patent specification by the inventors related to US 2006/0219867 filed on Mar. 30, 2006 by the assignor and laid open on Oct. 5, 2006. The n/p+ substrate has a structure where an n-type semiconductor layer has been deposited on a $p^+$-type substrate by the epitaxial growth method. When phosphorus ion-implanted in the n-type semiconductor layer (hereinafter, referred to as the n-type epitaxial layer) deposited by the epitaxial growth method to form an n-type semiconductor layer of a photo diode, the depletion layer of the photo diode extends more easily than when the $p/p^+$ substrate is used. Therefore, carriers can be gathered efficiently in the photo diode, improving the sensitivity. Moreover, the shortness of the lifetime of carriers can be made use of, which enables the deterioration of image quality, such as blooming or light mixture, to be suppressed.

When CMOS image sensors are formed using the $n/p^+$ substrate, there are several points to keep in mind. A first point to keep in mind is the element isolation between a plurality of photo diodes. In the $n/p^+$ substrate, since the n-type semiconductor layer of a photo diode is formed in the n-type epitaxial layer, the photo diodes would be electrically connected to each other if they were left as they were. A second point to keep in mind is that a p-n junction surface appears at the dicing surface of the chip. The interface between the $p^+$-type substrate and the n-type epitaxial layer, that is, a p-n junction surface, appears at the cut surface of the device chips diced along the dicing lines from a Si wafer in which a plurality of CMOS image sensors have been formed. When a p-n junction surface appears at the chip cut surface, the surface of the cutting plane becomes the cause of the occurrence of leakage current or is at high risk of acting as a flow channel of leakage current. Eventually, the possibility of increasing the leakage current will get greater.

The specification of the US 2006/0219867 has disclosed that a p-type semiconductor region has been formed in an element isolating region enclosing each photo diode in a plane and in a dicing region by implanting, for example, boron ions. Since boron ions are diffused from the $p^+$-type substrate toward the n-type epitaxial layer in a heat treatment process or the like when the p-type semiconductor region is formed, a p-type semiconductor region is formed continuously by a p-type semiconductor region produced by boron ion implantation and boron diffusion from the $p^+$-type base substrate.

When boron impurities are diffused from the $p^+$-type substrate toward the n-type epitaxial layer, a part of the n-type epitaxial layer left without boron diffusion becomes a region where a photo diode is to be formed. Since the depth of the photo diode varies according to a subtle change in the heat history, there is a possibility that a variation in the sensitivity will become larger. Moreover, the deepest site of the photo diode in the depth direction (the tip in the depth direction) is determined by the limit of the acceleration of boron ions implantation in forming a p-type semiconductor region. For this reason, the number of carriers is restricted and therefore the sensitivity is limited.

BRIEF SUMMARY OF THE INVENTION

According to a first aspect of the invention, there is provided a solid-state imaging device comprising: a semiconductor substrate which includes p-type impurities; a p-type epitaxial layer which is formed on the semiconductor substrate and includes p-type impurities whose concentration is lower than that of the semiconductor substrate; an n-type epitaxial layer which includes n-type impurities formed on the p-type epitaxial layer; a plurality of photoelectric conversion parts which are included n-type regions provided at the surface region of the n-type epitaxial layer; and a plurality of element isolating regions which are formed in the n-type epitaxial layer to enclose each of the photoelectric conversion parts in a plane and each of which includes a first p-type semiconductor layer that is formed to reach the p-type epitaxial layer from the surface region of the n-type epitaxial layer and isolates the photoelectric conversion parts from one another.

According to a second aspect of the invention, there is provided a method of manufacturing a solid-state imaging device, comprising: preparing a three-layer structure substrate having a semiconductor substrate including p-type impurities, a p-type epitaxial layer which is formed on the semiconductor substrate and includes p-type impurities whose concentration is lower than that of the semiconductor substrate, and an n-type epitaxial layer which is formed on the p-type epitaxial layer and includes n-type impurities; forming a plurality of photoelectric conversion parts included n-type semiconductor regions at the surface region of the n-type epitaxial layer; and forming a plurality of first p-type semiconductor layers to isolate the photoelectric conversion parts from one another to enclose each of the photoelectric conversion parts in a plane and reach the p-type epitaxial layer from the surface region of the n-type epitaxial layer.

BRIEF DESCRIPTION OF THE SEVERAL VIEWS OF THE DRAWING

FIG. 3 is a sectional view of FIG. 1; and

DETAILED DESCRIPTION OF THE INVENTION

Figure 1:
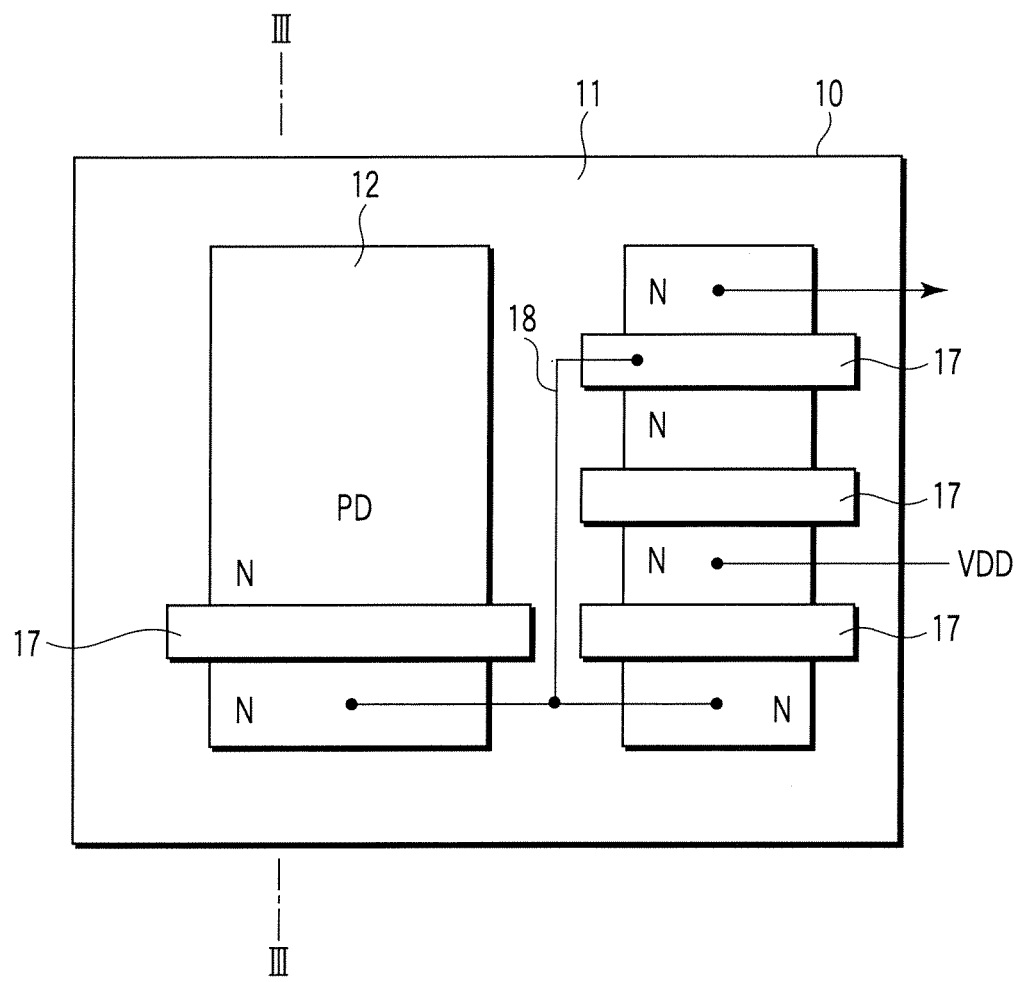
FIG. 1 is a plan view of a unit pixel of a CMOS image sensor according to an embodiment of the invention.
Figure 2:
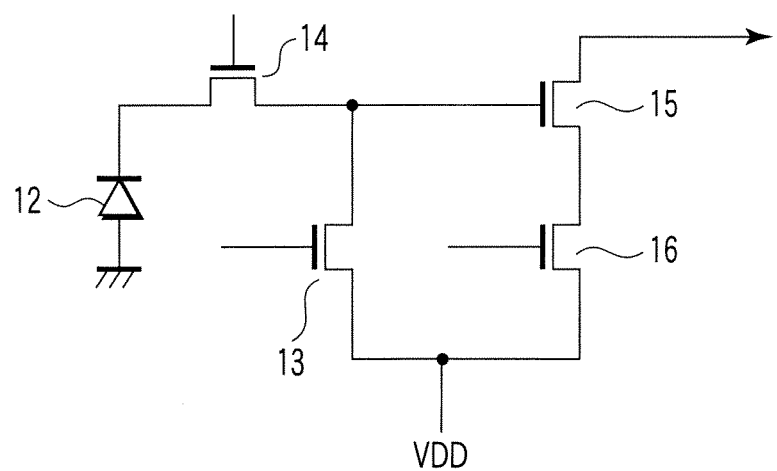
FIG. 2 is a circuit diagram of an equivalent circuit of the unit pixel in FIG. 1.

Hereinafter, referring to the accompanying drawings, an embodiment of the invention will be explained. In a CMOS image sensor according to the embodiment, a large number of unit pixels (or unit cells) are integrated on a semiconductor substrate composed of an $n/p^-/p^+$ substrate. FIG. 1 is a plan view of a pattern of a region where the unit pixels (or unit cells) of a CMOS image sensor have been formed. FIG. 2 is a circuit diagram of an equivalent circuit of the unit cell in FIG. 1.

As shown in FIG. 1, a unit cell region 10 is surrounded on all four sides by an element isolating region 11 provided at the surface region of a semiconductor substrate. A plurality of unit cell regions 10 is isolated from one another with the element isolating region 11. Formed in each unit cell region 10 are the n-type activating regions of a plurality of transistors each composed of a photo diode (PD) 12, and a reset transistor 13, a read transistor 14, an amplifying transistor 15, and an address transistor 16 which are shown in FIG. 2. On the semiconductor substrate, a gate electrode (or a gate wiring line) 17 of each of the transistors has been formed via a gate insulating film. Furthermore, an interlayer insulating film and a plurality of metal wiring layers 18 have been formed.

FIG. 3 shows a sectional view of the unit cell region taken along line III-III in FIG. 1 together with a dicing line part 19 where a dicing line along which each CMOS image sensor chip is diced. A semiconductor substrate 20 is composed of an $n/p^-/p^+$ substrate which has a 3-layer semiconductor structure. Specifically, in the semiconductor substrate 20, a $p^-$-type semiconductor layer 22 and an n-type semiconductor layer 23 are stacked in that order on a $p^+$-type substrate 21 serving as a base substrate by the epitaxial growth method. The $p^-$-type semiconductor layer 22 has a thickness of, for example, 3 μm and the n-type semiconductor layer 23 has a thickness of, for example, 4 μm. In FIG. 3, the $p^-$-type semiconductor layer 22 and n-type semiconductor layer 23 are not necessarily shown according to the actual dimensional ratio.

The $p^+$-type substrate 21 has a relatively high p-type impurity concentration, for example, a boron impurity concentration of about 1 to $5 \times 10^{18}$ cm$^{-3}$. The $p^-$-type semiconductor layer (hereinafter, referred to as the $p^-$-type epitaxial layer) 22 has a relatively low p-type impurity concentration, for example, a boron impurity concentration of about 1 to $5 \times 10^{16}$ cm$^{-3}$. The n-type semiconductor layer (hereinafter, referred to as the n-type epitaxial layer) 23 has an n-type impurity concentration, for example, a phosphorous impurity concentration of 1 to $5 \times 10^{15}$ cm$^{-3}$.

Furthermore, on the n-type epitaxial layer 23, an n-type semiconductor region (or n-type region) 24 of the photo diode 12 has been formed by implanting, for example, phosphorous impurity ions. The peak depth of the phosphorous impurity concentration in the n-type region 24 is determined mainly by energy at the time of ion implantation. At the surface of the n-type region 24, a shield layer 25 having a relatively high concentration of p-type impurity, such as boron, for example, a concentration of about 1 to $5 \times 10^{19}$ cm$^{-3}$. Moreover, an n-type region 26 acting as an activating region of the read transistor 14 has been formed apart from the n-type region 24. In addition, on the substrate between the n-type regions 24, 26, a gate electrode 17 of the read transistor 14 has been formed via a gate insulating film.

When the above-described $n/p^-/p^+$ substrate 20 is used, forming the n-type region 24 of a photo diode solely on the n-type epitaxial layer 23 allows photo diodes to connect electrically with each other between unit cells. When photo diodes connect electrically with each other, this prevents the electrons generated at the photo diode from becoming the signal of the unit cell to be subjected to signal processing.

Therefore, in the embodiment, to separate each n-type region 24 electrically from the n-type region 24 of an adjacent photo diode, a barrier layer 27 included a p-type semiconductor region acting as an element isolating region has been formed in a region enclosing the n-type region 24 of the photo diode in a plane. The barrier layer 27 and the $p^-$-type epitaxial layer 22 have almost the same concentration. The $p^-$-type epitaxial layer 22 has the function of making the tip of the photo diode in the depth direction deeper in the depth direction of the substrate without damaging the region of the $p^+$-type substrate 21.

After a plurality of unit cells have been formed in the semiconductor substrate composed of the $n/p^-/p^+$ substrate 20, when a p-n junction surface appears at the cut surface of a chip obtained by dicing, leakage current is generated between the $p^+$-type substrate 21 in the deep part of the substrate and the n epitaxial layer 23 near the substrate surface. The leakage current is the cause of irregularity in darkness of the device characteristic.

Therefore, in the embodiment, boron impurity ions are implanted into a dicing line part (or chip cutting part) 19 of the semiconductor substrate to form a p-type semiconductor region 28, thereby limiting all of the cut surfaces of the diced chips to only p-type semiconductor layers. At the surface of the substrate in which the p-type semiconductor region 28 has been formed, an STI region 11 has been formed. In this case, if boron ions are implanted into the dicing line part 19 to form the p-type semiconductor region 28 at the same time the barrier layer 27 is formed so as to enclose a PD in a plane, it is not necessary to add a special process of turning the dicing line part 19 into a p-type semiconductor.

In the $n/p^-/p^+$ substrate shown in FIG. 3, the concentration of p-type impurity is set high in a deep position about 7 μm or less from the surface (or deep layer part). Generally, in a region where the concentration of p-type impurity is high, the lifetime of carriers (electrons) is short and carriers recombine with holes instantly. Accordingly, even if the electrons generated in the $n/p^-/p^+$ substrate 20 have diffused into the deep layer part of the substrate, the electrons recombine with holes immediately. Moreover, even if electrons generated in a shallow position about 3 μm or less from the surface of the $n/p^-/p^+$ substrate 20 try to diffuse into the deep layer part of the substrate, they are bounced toward the substrate surface by the potential barrier existing near the interface (or p-n junction surface) between the n-type epitaxial layer 23 and the $p^-$-type epitaxial layer 22 where the concentration of p-type impurity changes rapidly.

Next, referring to FIGS. 1 to 3, an example of the process of manufacturing a CMOS image sensor of the embodiment will be roughly explained. First, an $n/p^-/p^+$ substrate 20 having a three-layer structure is prepared. In producing the $n/p^-/p^+$ substrate 20, a $p^+$-type silicon (Si) substrate 21 is used as a base substrate. On the $p^+$-type silicon substrate 21, a $p^-$ type epitaxial layer 22 and an n-type epitaxial layer 23 are deposited in that order by the epitaxial growth method. At this time, normally, the growth rate of each of the $p^-$-type epitaxial layer 22 and n-type epitaxial layer 23 is set to about 1 μm/minute. With this setting, impurities hardly diffuse (or move). For this reason, the impurity concentration profile changes sharply near the interface between the $p^+$-type substrate 21 and the $p^-$-type epitaxial layer 22 and near the interface between the $p^-$-type epitaxial layer 22 and the n-type epitaxial layer 23.

Next, by a conventional process, n-type activating regions 26 serving as the drain/source region of each of the transistors 14 to 16 are formed at the surface of the substrate. Moreover, on the surface of the substrate, gate wiring lines 17 are formed via gate insulating films.

Then, a plurality of PDs serving as photoelectric conversion parts are formed at the surface region of the n-type epitaxial layers 23 by a conventional process in such a manner that they are separated from one another. Specifically, on the surface of the n-type epitaxial layer 23, a resist film is applied in a specific pattern and then subjected to patterning. Thereafter, phosphorus ions acting as n-type impurities are implanted into the surface region of the n-type epitaxial layers 23, thereby forming a plurality of n-type semiconductor regions (n-type regions) 24. At this time, the depth of the phosphorus concentration peak is determined mainly by the amount of energy in implanting phosphorus ions. In the embodiment, the phosphorus ion implanting condition is set to, for example, an accelerating voltage of 300 KV and a dose amount of $1.2 \times 10^{12}$ cm$^{-2}$. This enables the phosphorus concentration peak to be formed at a depth of about 0.4 μm from the substrate surface as a phosphorus concentration profile of the n-type region 24.

Thereafter, a plurality of trenches for isolating elements is formed in the surface region of the n-type epitaxial layers 23. The trenches are formed so as to reach a depth of about 0.3 to 0.35 μm from the surface of the n-type epitaxial layers 23. Then, for example, an oxide film is embedded in the trenches as an element isolation insulating film, thereby forming an STI (Shallow Trench Isolation) region 11.

Then, a p-type semiconductor region 27 included a plurality of layers is formed from the surface of the n-type epitaxial layer 24 toward the $p^-$-type epitaxial layer 22 in a plane pattern separately enclosing the n-type regions 24 of the individual PDs. Each p-type semiconductor region 27 is formed by implanting, for example, boron ions as p-type impurities into the n-type epitaxial layer 23 at a plurality of times. In each p-type semiconductor region 27, the boron concentration in the central part 27a is higher than that in the peripheral part.

In the embodiment, to form, for example, a five-layer p-type semiconductor region 27 on the underside of each STI region 11 and on the underside of the n-type activating region 26, boron ions are implanted five times. The accelerating voltage and dose amount conditions for the five boron ion implantations are set in this order: for example, about 200 KV and $1 \times 10^{12}$ to $1 \times 10^{13}$ cm$^{-2}$, about 400 KV and $1 \times 10^{11}$ to $1 \times 10^{12}$ cm$^{-2}$, about 650 KV and $1 \times 10^{11}$ to $1 \times 10^{12}$ cm$^{-2}$, about 1100 KV and $1 \times 10^{11}$ to $1 \times 10^{12}$ cm$^{-2}$, and about 1700 KV and $1 \times 10^{11}$ to $1 \times 10^{12}$ cm$^{-2}$. Under such conditions, when born ions are implanted, the n-type epitaxial layer 23 between each STI region 11 and the surface region of the $p^-$-type epitaxial layer 22 and the n-type epitaxial layer 23 between the n-type activating region 26 and the surface region of the $p^-$-type epitaxial layer 22 are embedded with the five-layer p-type semiconductor region 27, leaving no space between them, which practically turns the n-type epitaxial layers into p-type semiconductors. Consequently, the five-layer p-type semiconductor region 27, together with the $p^-$-type epitaxial layer 22, functions as a barrier layer which electrically separates the n-type region 24 of each PD from the n-type region 24 of an adjacent PD.

In heat diffusion in the ion implanting process, too, boron impurities in the p-type semiconductor layer ($p^+$-type substrate 21 and $p^-$-type epitaxial layer 22) oozes toward the n-type epitaxial layer 23. As a result, the p-n junction surface, the junction interface between the n-type epitaxial layer 23 and the $p^-$-type epitaxial layer 22, goes up more toward the substrate surface than before ion implantation. Specifically, the thickness of the n-type epitaxial layer 23 at the time when five ion implantations have been completed is about 2.0 μm and the p-n junction surface is located at a depth of about 2.0 μm from the substrate surface.

Furthermore, in the embodiment, when the p-type semiconductor region 27 is formed by implanting boron ions into the n-type epitaxial layer 23 as described above, boron ions are similarly implanted into the chip cutting parts (dicing line parts) 19 where the $n/p^-/p^+$ substrate is diced into a plurality of chips. As a result, a five-layer p-type semiconductor region 28 is formed continuously without a break along the individual dicing line parts 19 so as to reach the surface region of the p-epitaxial layer 22 from the surface of the n epitaxial layer 23, thereby practically turning the region from the substrate surface to p-epitaxial layer into a p-type semiconductor. In each p-type semiconductor region 28, the boron concentration in the central part 28a is higher than that in the peripheral part.

By the above-described processes, the individual p-type semiconductor regions 27 acting as the barrier layer and the p-type semiconductor regions 28 of the individual dicing line parts 19 can be formed easily at the same time without increasing the number of processes. Since each dicing line part 19 is composed of the STI region 11, p-type semiconductor region 28, p$^-$-type epitaxial layer 22, and p$^+$-type substrate 21 in that order from the substrate surface to the underside surface, when the n/p$^-$/p$^+$ substrate is diced into a plurality of chips along the individual dicing line parts 19 in a post-process, no p-n junction surface appears at the chip cut surface.

Next, to give a Surface Shield Sensor structure (S3 structure) to the n-type region 24 of each PD, the surface region (n-type semiconductor layer) of the n-type region 24 of each PD is covered with a p-type semiconductor layer (PD-p layer), thereby forming a shield layer 25. Specifically, first, a resist film is applied to the surface of the n-type region 24 of each PD in a specific pattern and then subjected to patterning. Thereafter, boron ions are implanted. At this time, boron ions are implanted in a dose amount of $1 \times 10^{13}$ cm$^{-2}$ at an accelerating voltage of 10 KV. As a result, not only is the n-type region 24 practically performing photoelectric conversion embedded in the surface region (n-type epitaxial layer 23) of the n/p$^-$/p$^+$ substrate, but also the n-type region 24 of each PD with the S3 structure is formed. In the S3 structure, the surface of each n-type region 24 is shielded with a shield layer (PD-p layer) 25 having a high concentration (about $1 \times 10^{19}$ cm$^{-3}$) of p-type impurity.

Furthermore, after a CMOS image sensor has been formed through specific processes, including a conventional process of forming Al wiring lines, the n/p$^-$/p$^+$ substrate is diced into individual chips along the dicing line parts 19. As a result, a CMOS image sensor with the desired structure formed using the n/p$^-$/p$^+$ substrate is obtained.

In various heat treatment processes in the process of manufacturing CMOS image sensors of the embodiment using the n/p$^-$/p$^+$ substrate, boron, p-type impurity, diffuses (or oozes) from the p$^-$-type epitaxial layer 22 toward the n-type epitaxial layer 23 as described above. As the CMOS image sensor manufacturing processes proceed, the region of the p$^-$-type epitaxial layer 22 extends gradually toward the substrate surface, with the result that the p-n junction surface moves gradually from a deep position in the substrate toward a shallow position. As a result, each STI region 11 or n-type activating region 26 formed at the surface region of the n-type epitaxial layer 23 and the p$^-$-type epitaxial layer 22 can be connected to each other continuously with the multilayer p-type semiconductor region 27 serving as a barrier layer. This enables each p-type semiconductor region 27 and p$^-$-type epitaxial layer 22 to enclose the n-type region 24 of each PD separately and three-dimensionally to separate the n-type regions 24 electrically.

In the CMOS image sensor with the above structure, even if intense light, such as sunlight, enters the n-type region 24 of each PD and electrons leak from the n-type region 24 of the PD, the movement of the electrons is limited by each p-type semiconductor region 27 and p$^-$-type epitaxial layer 22. That is, there is almost no possibility that the electrons leaked from the n-type region 24 of each PD will pass through a deep position in the n/p$^-$/p$^+$ substrate and enter the n-type region 24 of an adjacent PD. Accordingly, in the CMOS image sensor, from the viewpoint of its device structure, there is almost no possibility that blooming and the like will take place. Moreover, the pixel part can be formed by the same method as producing CMOS image sensors using a conventional p/p$^+$ substrate. That is, the pixel part of a CMOS image sensor can be formed without requiring a special process for the n/p$^-$/p$^+$ substrate.

Figure 4:
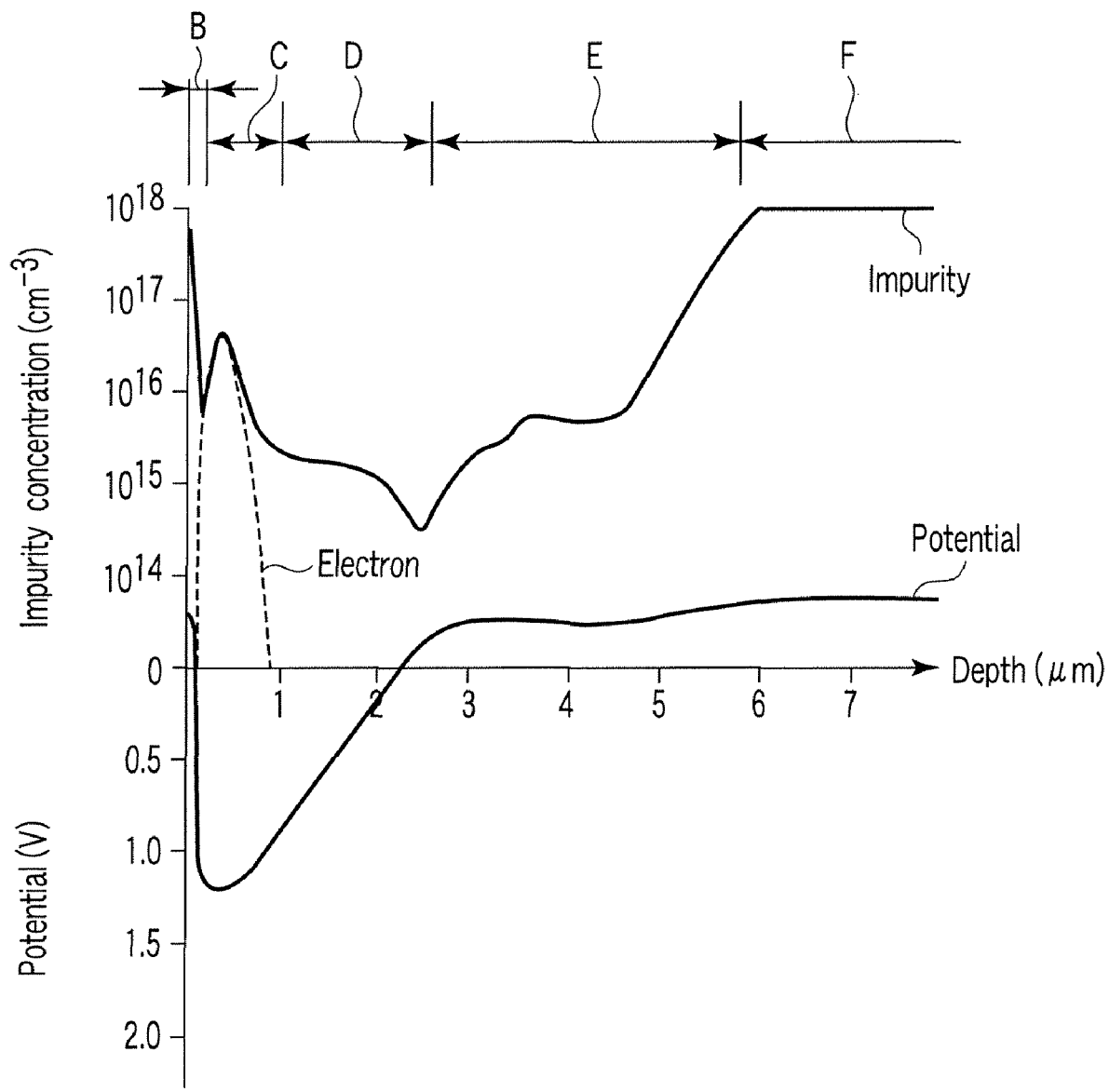
FIG. 4 is a distribution diagram showing the PD of FIG. 3, the impurity concentration in the depth direction of the lower part of the PD, electrons, and the profile of the potential.

FIG. 4 schematically shows an example of the PD part of FIG. 3, the concentration of impurities (phosphorous, boron) in the depth direction of the lower part of the PD, electrons, and the distribution (profile) of the potential.

In the distribution shown in the upper part of FIG. 4, a region shown by B represents an impurity concentration in the shield layer (PD-p layer) 25, a region shown by C represents an impurity concentration in the n-type semiconductor layer of the n-type region 24 of a PD, and a region shown by D represents an impurity concentration in the n-type epitaxial layer 23. Moreover, a region shown by E represents an impurity concentration in the p$^-$-type epitaxial layer 22 and a region shown by F represents an impurity concentration in the p$^+$-type substrate 21.

As seen from the impurity concentration distribution of FIG. 4, since the impurity in each layer differs at the interface between the p$^-$-type epitaxial layer 22 and n-type epitaxial layer 23 located at a depth of about 3 μm from the substrate surface, the impurity concentration changes sharply, producing a sharp profile. Since the impurity in each layer is the same at the interface between the n-type epitaxial layer 23 and the n-type region 24 of a PD, the impurity concentration changes smoothly. Then, in the n-type region 24 of the PD, the n-type impurity concentration reaches a peak at a depth of about 0.4 μm. In addition, since the impurity in each layer differs at the interface between the n-type region 24 of the PD and the PD-p layer 25, the impurity concentration drops temporarily. Then, in the shield layer (PD-p layer) 25, the phosphorus impurity concentration reaches a peak near its surface.

As is clear from the electron distribution shown by a broken line in FIG. 4, the peak (local maximum) of the distribution of electrons (carriers) in the n/p–/p+ substrate almost coincides with the peak (local maximum) of the n-type impurity concentration in the n-type region 24 of the PD.

Furthermore, as seen from the potential distribution and impurity concentration distribution shown in FIG. 4, the position where the potential in the n/p$^-$/p$^+$ substrate reaches a local minimum (least) almost coincides with the peak (local maximum) of the n-type impurity concentration in the n-type region 24 of the PD and the peak (local maximum) of the electron distribution. The behavior of electrons in the n/p$^-$/p$^+$ substrate is highly consistent with a generally-known physical phenomenon. Specifically, even if electrons generated in the n/p$^-$/p$^+$ substrate by photoelectric conversion at the n-type region 24 of each PD leak from the n-type region 24 of each PD try to diffuse toward the p$^+$-type substrate 21, the deep layer side of the n/p$^-$/p$^+$ substrate, they are bounced by the potential barrier toward the surface region of the n/p$^-$/p$^+$ substrate. Then, the electrons leaked from the n-type region 24 of each PD eventually gather again by diffusion in the n-type region 24 of each PD where the potential is low in the n/p$^-$/p$^+$ substrate. The electrons leaked from the n-type region of each PD are gathered again particularly in a position where the impurity concentration has reached a peak in the n-type region 24 of the PD where the potential in the n/p$^-$/p$^+$ substrate is at a local minimum (least). As a result, in the CMOS image sensor of the embodiment using the n/p⁻/p⁺ substrate, the sensitivity of the n-type region 24 of each PD can be improved.

As described above, in the CMOS image sensor using the n/p⁻/p⁺ substrate, the concentration profile of each of p-type impurity (B) and n-type impurity (P) in the n/p⁻/p⁺ substrate can be set easily to an impurity concentration profile capable of improving the sensitivity of the n-type region 24 of each PD.

As explained above, in the CMOS image sensor of the embodiment, the structure of the substrate has been improved, thereby improving the sensitivity, which enables the phenomenon of carriers entering adjacent PDs (color mixture), blooming, and leakage current at the chip cut surface to be decreased. Accordingly, in the CMOS image sensor, the sensitivity of the n-type region 24 of each PD has been improved without increasing the photo acceptance surface area of the n-type region 24 of the PD or raising the driving voltage of the CMOS image sensor. Moreover, in the CMOS image sensor, there is almost no possibility that degradation of the picture quality, such as blooming or color mixture, will occur and leakage current will develop. Furthermore, the embodiment is effective in solving the problem of a decrease in the sensitivity due to the miniaturization of cells in the recent CMOS image sensors, which makes it possible to realize a CMOS image sensor effective for further miniaturization.

A solid-state imaging device according to the invention is not limited to the above-described embodiment and may be embodied by changing the configuration variously, setting a part of the manufacturing processes variously, or combining various settings suitably without departing from the spirit or character of the invention.

For instance, the element isolating region 11 formed at the surface region of the CMOS image sensor is not necessarily the aforementioned STI region. A LOCOS may be formed in place of the STI region. The STI region need not necessarily be formed before the p-type semiconductor regions 27, 28 are formed. For example, the STI region may be formed after the p-type semiconductor regions 27, 28 are formed.

Moreover, the gate electrode and the like of the read transistor need not necessarily be formed before the n-type region 24 of a PD is formed. For example, the gate electrode and the like of the read transistor may be formed after the n-type region 24 of the PD is formed.

In addition, while in the embodiment of FIG. 1, a one-pixel one-cell structure has been explained, the invention is not restricted to this. The invention may be applied to a multipixel one-cell structure, such as a two-pixel one-cell structure or a four-pixel one-cell structure, which produces the same effect.

Furthermore, while in the equivalent circuit diagram of FIG. 2, a case where one cell includes four transistors (a reset transistor 13, a read transistor 14, an amplifying transistor 15, and an address transistor 16) has been explained, a cell structure without, for example, an address transistor, can also produce the same effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
    a semiconductor substrate which includes p-type impurities;
    a p-type epitaxial layer which is formed on the semiconductor substrate and includes p-type impurities whose concentration is lower than that of the semiconductor substrate;
    an n-type epitaxial layer which includes n-type impurities formed on the p-type epitaxial layer;
    a plurality of photoelectric conversion parts which are included n-type regions provided at the surface region of the n-type epitaxial layer;
    a plurality of element isolating regions which are formed in the n-type epitaxial layer to enclose each of said plurality of photoelectric conversion parts in a plane and each of which includes a first p-type semiconductor layer that is formed to reach the p-type epitaxial layer from the surface region of the n-type epitaxial layer and isolates said plurality of photoelectric conversion parts from one another; and
    a chip cutting part dividing an element-formed semiconductor substrate into chips and that includes an element isolation insulating film formed at the surface region of the n-type epitaxial layer and a second p-type semiconductor layer formed to reach the p-type epitaxial layer from the surface region of the n-type epitaxial layer along the region where the element isolation insulating film is formed.

2. The solid-state imaging device according to claim 1, wherein each of the element isolating regions includes an element isolation insulating film formed at the surface region of the n-type epitaxial layer in the upper part of the first p-type semiconductor layer.

3. The solid-state imaging device according to claim 2, wherein the element isolation insulating film is filled in a trench formed in the surface region of the n-type epitaxial layer.

4. The solid-state imaging device according to claim 1, wherein the first p-type semiconductor layer includes a plurality of semiconductor layers each formed in a different position in the depth direction of the substrate.

5. The solid-state imaging device according to claim 1, wherein the p-type impurities included in the semiconductor substrate and the p-type epitaxial layer are boron and the n-type impurities included in the n-type epitaxial layer are phosphorous and the first p-type semiconductor layer includes boron as p-type impurities.

6. The solid-state imaging device according to claim 5, wherein the p-type impurities included in the p-type epitaxial layer and those included in the first p-type semiconductor layer have the same impurity concentration.

7. The solid-state imaging device according to claim 1, wherein the second p-type semiconductor layer includes a plurality of semiconductor layers each formed in a different position in the depth direction of the substrate.

8. The solid-state imaging device according to claim 1, wherein the p-type impurities included in the semiconductor substrate and the p-type epitaxial layer are boron and the n-type impurities included in the n-type epitaxial layer are phosphorous and the first and second p-type semiconductor layers include boron as p-type impurities.

9. The solid-state imaging device according to claim 1, further comprising a shield layer which includes p-type impurities formed at the surface region of each of said plurality of photoelectric conversion parts.

* * * * *